(12) United States Patent
Qiu et al.

(10) Patent No.: US 11,899,055 B2
(45) Date of Patent: Feb. 13, 2024

(54) CIRCUIT BOARD AND METHOD AND DEVICE RELATED TO THE SAME

(71) Applicant: Shanghai AVIC OPTO Electronics Co., Ltd., Shanghai (CN)

(72) Inventors: Pengfei Qiu, Shanghai (CN); Lihua Wang, Shanghai (CN); Yimiao Ding, Shanghai (CN); Tingting Li, Shanghai (CN); Shumian Xu, Shanghai (CN); Yang Nan, Shanghai (CN)

(73) Assignee: Shanghai AVIC OPTO Electronics Co., Ltd., Shanghai (CN)

( * ) Notice: Subject to any disclaimer, the term of this patent is extended or adjusted under 35 U.S.C. 154(b) by 0 days.

(21) Appl. No.: 17/656,427

(22) Filed: Mar. 25, 2022

(65) Prior Publication Data

US 2022/0214394 A1    Jul. 7, 2022

(30) Foreign Application Priority Data

Dec. 30, 2021   (CN) .......................... 202111666014.3

(51) Int. Cl.
| | | |
|---|---|---|
| *G01R 31/28* | (2006.01) | |
| *H05K 1/18* | (2006.01) | |
| *G09G 3/00* | (2006.01) | |

(52) U.S. Cl.
CPC ..... *G01R 31/2815* (2013.01); *G01R 31/2818* (2013.01); *G09G 3/006* (2013.01); *H05K 1/18* (2013.01); *H05K 2201/10128* (2013.01)

(58) Field of Classification Search
CPC ............ G01R 31/2815; G01R 31/2818; G09G 3/006; G09G 2300/0819;

(Continued)

(56) References Cited

U.S. PATENT DOCUMENTS

| | | | |
|---|---|---|---|
| 2010/0188318 A1* | 7/2010 | Ishii ..................... | G09G 3/3283 345/76 |
| 2011/0074429 A1* | 3/2011 | Levey .................. | G09G 3/3225 324/414 |

(Continued)

FOREIGN PATENT DOCUMENTS

| | | |
|---|---|---|
| CN | 105096786 A | 11/2015 |
| CN | 106683605 A | 5/2017 |

(Continued)

OTHER PUBLICATIONS

Office Action of Chinese Patent Application No. 202111666014.3 dated Oct. 31, 2022.

*Primary Examiner* — Akm Zakaria
(74) *Attorney, Agent, or Firm* — KILPATRICK TOWNSEND & STOCKTON LLP

(57) ABSTRACT

A circuit board and a method for electrical performance detection thereof, a display panel, a method for fabricating a display panel, and a method for driving the display panel are provided. In the electrical performance detection, the signal output terminal is electrically connected to the detection terminal, and detection is performed on the drive signal by the electrical performance detection circuit to determine whether the circuit board is abnormal, achieving the electrical performance detection of the circuit board. In addition, in a process other than the electrical performance detection, the signal output terminal is disconnected from the detection terminal to avoid affecting a normal operation of the circuit board. The electrical performance detection of the circuit board is realized, a defective circuit board is prevented from flowing into a subsequent fabricating procedure, and waste of assembling resources is avoided.

16 Claims, 16 Drawing Sheets

(58) Field of Classification Search
CPC ... G09G 2300/0842; G09G 2300/0861; G09G 2320/0238; G09G 2320/0295; G09G 2330/10; G09G 3/3233; H05K 1/18; H05K 2201/10128; H05K 1/0268; H05K 2201/10106
See application file for complete search history.

(56) References Cited

U.S. PATENT DOCUMENTS

| | | | |
|---|---|---|---|
| 2013/0070135 A1* | 3/2013 | Bahukhandi | H04N 25/75 |
| | | | 348/300 |
| 2017/0053577 A1* | 2/2017 | Cao | G09G 3/006 |
| 2017/0154556 A1 | 6/2017 | Cao et al. | |
| 2020/0152101 A1* | 5/2020 | Li | G09G 3/30 |
| 2022/0293058 A1* | 9/2022 | Lee | G09G 3/3233 |

FOREIGN PATENT DOCUMENTS

| | | |
|---|---|---|
| CN | 104809970 B | 11/2017 |
| CN | 109859672 A | 6/2019 |
| CN | 112327222 A | 2/2021 |
| CN | 212624745 U | 2/2021 |
| CN | 112885275 A | 6/2021 |

\* cited by examiner

CIRCUIT BOARD AND METHOD AND DEVICE RELATED TO THE SAME

This application claims priority to Chinese Patent Application No. 202111666014.3, titled "CIRCUIT BOARD AND METHOD AND DEVICE RELATED TO THE SAME", filed on Dec. 30, 2021 with the China National Intellectual Property Administration, which is hereby incorporated by reference in its entirety.

FIELD

The present disclosure relates to the field of display technology, and in particular to a circuit board and a method for electrical performance detection of a circuit board, and a display panel, a method for fabricating a display panel, and a method for driving a display panel.

BACKGROUND

A process of fabricating a display panel generally includes several procedures, such as preparation of a circuit board (array substrate, backboard, and the like), assembling of light-emitting elements, and packaging. In the process of fabricating the display panel, an electrical performance test is usually performed after the assembling of light-emitting elements to detect a defect, in order to prevent a defective display panel from flowing into a subsequent procedure. However, for a conventional display panel, even a defect in electrical performance is detected in the electrical performance test after assembling of light-emitting elements, it is impossible to determine whether an abnormality occurs on the circuit board or during the assembling of light-emitting elements.

SUMMARY

In view of the above, a circuit board and a method for electrical performance detection of a circuit board, a display panel, a method for fabricating a display panel, and a method for driving a display panel are provided in the present disclosure, in order to solve the problems in the conventional technology, realizing electrical performance detection on a circuit board, preventing a defective circuit board from flowing into a subsequent fabricating procedure, and avoiding waste of assembling resources.

A circuit board includes multiple rows of pixel circuits for progressive scanning, and multiple detection terminals.

Each of the pixel circuits includes a drive device and a detection device. The drive device includes a signal output terminal for outputting a drive signal. The detection device includes an input terminal electrically connected to the signal output terminal, and an output terminal electrically connected to the detection terminal. The detection devices in one row of the pixel circuits are electrically connected to different detection terminals. The detection terminal is electrically connected to an external electrical performance detection circuit.

The detection device is configured to electrically connect the signal output terminal to the detection terminal in a process of electrical performance detection and when a drive signal is outputted from the signal output terminal; and disconnect the signal output terminal from the detection terminal in a process other than the electrical performance detection.

A method for electrical performance detection of a circuit board is further provided in the present disclosure. The method is applicable to detect the circuit board as described above. The method includes:

electrically connecting an electrical performance detection circuit to the detection terminal; and performing progressive scanning on the pixel circuits; and the detection device electrically connects the signal output terminal to the detection terminal at a moment when the drive signal is outputted from the signal output terminal, in a process of the progressive scanning.

A method for fabricating a display panel is further provided in the present disclosure. The method includes:

providing the circuit board as described above and multiple light-emitting elements;

performing electrical performance detection on the circuit board by the method for the electrical performance detection as described above; and fixing and electrically connecting the signal output terminals to the light-emitting elements.

A display panel is further provided in the present disclosure. The display panel includes the circuit board as described above and multiple light-emitting elements, where the light-emitting elements are electrically connected to the signal output terminals of the circuit board.

A method for driving a display panel is further provided in the present disclosure. The method is applicable to the display panel as described above. The method includes:

performing progressive scanning on the pixel circuits, and the detection device keeps disconnecting the signal output terminal from the detection terminal in a process of progressive scanning.

BRIEF DESCRIPTION OF THE DRAWINGS

The embodiments of the present disclosure are illustrated by, drawings and are described briefly hereinafter. Apparently, the drawings described in the following illustrate only some embodiments of the present disclosure.

DETAILED DESCRIPTION

The embodiments of the present disclosure are described clearly and completely in conjunction with the drawings of the embodiments of the disclosure hereinafter. It is apparent that the described embodiments are only some, rather than all, embodiments of the present disclosure.

As described in the background section, a process of fabricating a display panel generally includes several procedures, such as preparation of a circuit board (array substrate, backboard, and the like), assembling of light-emitting elements, and packaging. In the process of fabricating the display panel, an electrical performance test is usually performed after the assembling of light-emitting elements to detect a defect, in order to prevent a defective display panel from flowing into a subsequent procedure. However, for a conventional display panel, even a defect in electrical performance is detected in the electrical performance test after assembling of light-emitting elements, it is impossible to determine whether an abnormality occurs on the circuit board or during the assembling of light-emitting elements.

In view of this, a circuit board, a method for electrical performance detection of a circuit board, a display panel, a method for fabricating a display panel, and a method for driving a display panel are provided, in order to effectively solve problems existing in the conventional technology, achieve a purpose of performing electrical performance detection on the circuit board, prevent a defective circuit board from flowing into a subsequent procedure, and also avoid waste of assembling resources.

The embodiments of the present disclosure are as follows, which are described in detail with reference to FIG. 1 to FIG. 16.

Figure 1:
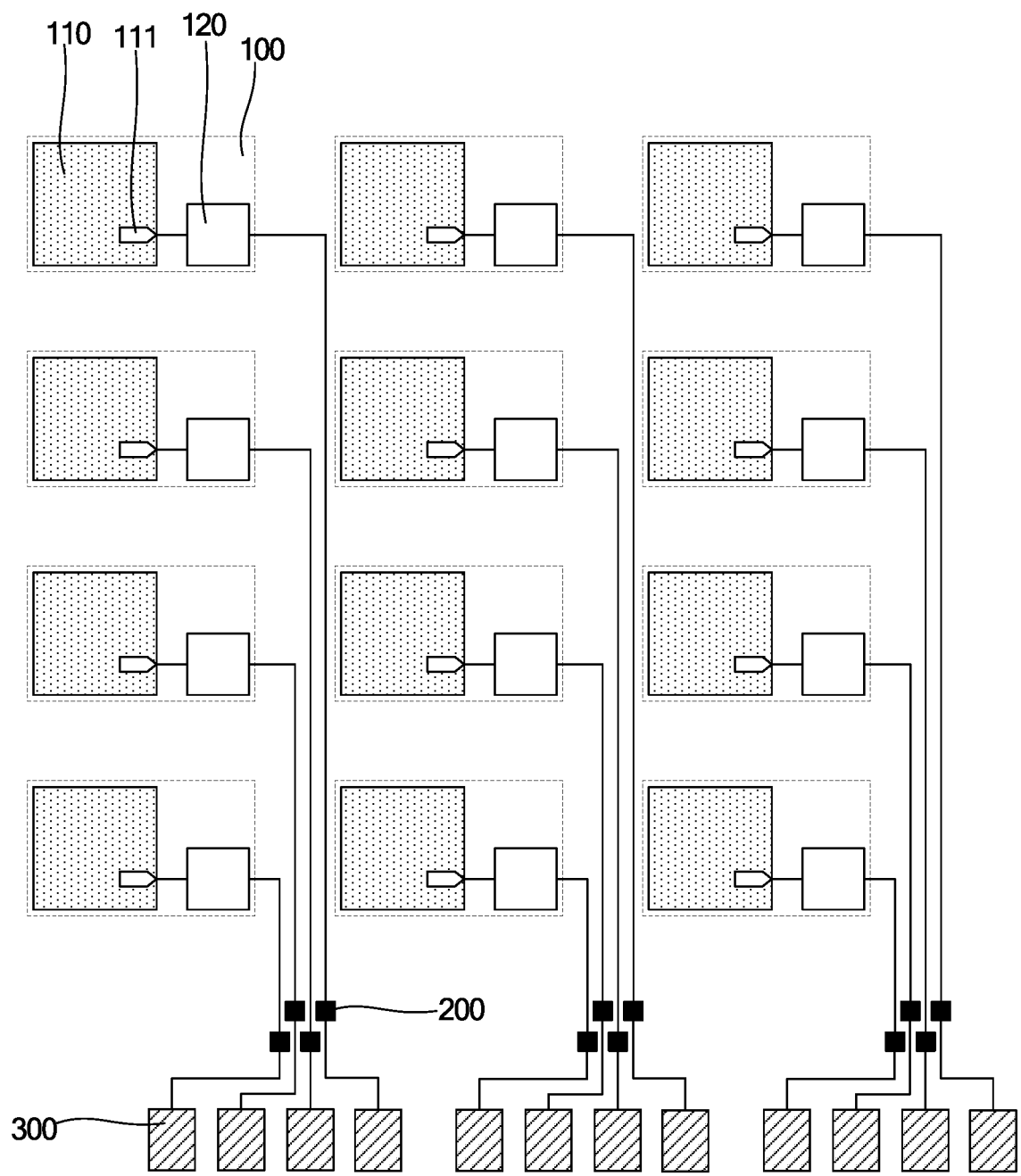
FIG. 1 is a schematic structural diagram of a circuit board according to an embodiment of the present disclosure.

Reference is made FIG. 1, which is a schematic structural diagram of a circuit board according to an embodiment of the present disclosure. Four rows of pixel circuits 100 are taken as an example in the embodiment of the present disclosure. The number of rows of the pixel circuits is to be determined based on an actual application, and FIG. 1 shows only one of applicable instances of the present disclosure. The circuit board according to the embodiment of the present disclosure includes multiple rows of pixel circuits 100 for progressive scanning, and multiple detection terminals 200.

Each of the pixel circuits 100 includes a drive device 110 and a detection device 120. The drive device 110 includes a signal output terminal 111 for outputting a drive signal. The detection device 120 has an input terminal electrically connected to the signal output terminal 111, and an output terminal electrically connected to the detection terminal 200. The detection devices 120 in one row of the pixel circuits 100 are electrically connected to different detection terminals 200. The detection terminal 200 is electrically connected to an external electrical performance detection circuit 300.

The detection device 120 is configured to electrically connect the signal output terminal 111 to the detection terminal 200 in a process of an electrical performance detection and when a drive signal is outputted from the signal output terminal 111; and disconnect the signal output terminal 111 from the detection terminal 200 in a process other than the electrical performance detection.

With the circuit board provided in the embodiment of the present disclosure, in the process of the electrical performance detection, a progressive scanning is performed on the pixel circuits to activate a pixel circuit 100. The signal output terminal 111 outputs a drive signal in a light-emission control stage of the pixel circuits 100. At the moment, the detection device 120 electrically connects the signal output terminal 111 to the detection terminal 200, and the drive signal is transmitted to the detection terminal 200 and collected by an electrical performance detection circuit 300 which is electrically connected to the detection terminal 200. The electrical performance detection circuit 300 performs analysis in response to the drive signal, to determine whether the pixel circuit 100 is abnormal. In this way, the electrical performance detection of the circuit board is performed. In addition, in a process other than the electrical performance detection, such as a normal display process of the display panel, the progressive scanning is performed on the pixel circuits to activate a pixel circuit 100. The signal output terminal 111 of the pixel circuit 100 outputs the drive signal. At this moment, the detection device 120 keeps disconnecting the signal output terminal 111 from the detection terminal 200, to prevent a transmission of the drive signal to the detection terminal 200, ensuring a normal screen display on the display panel.

Figure 2:
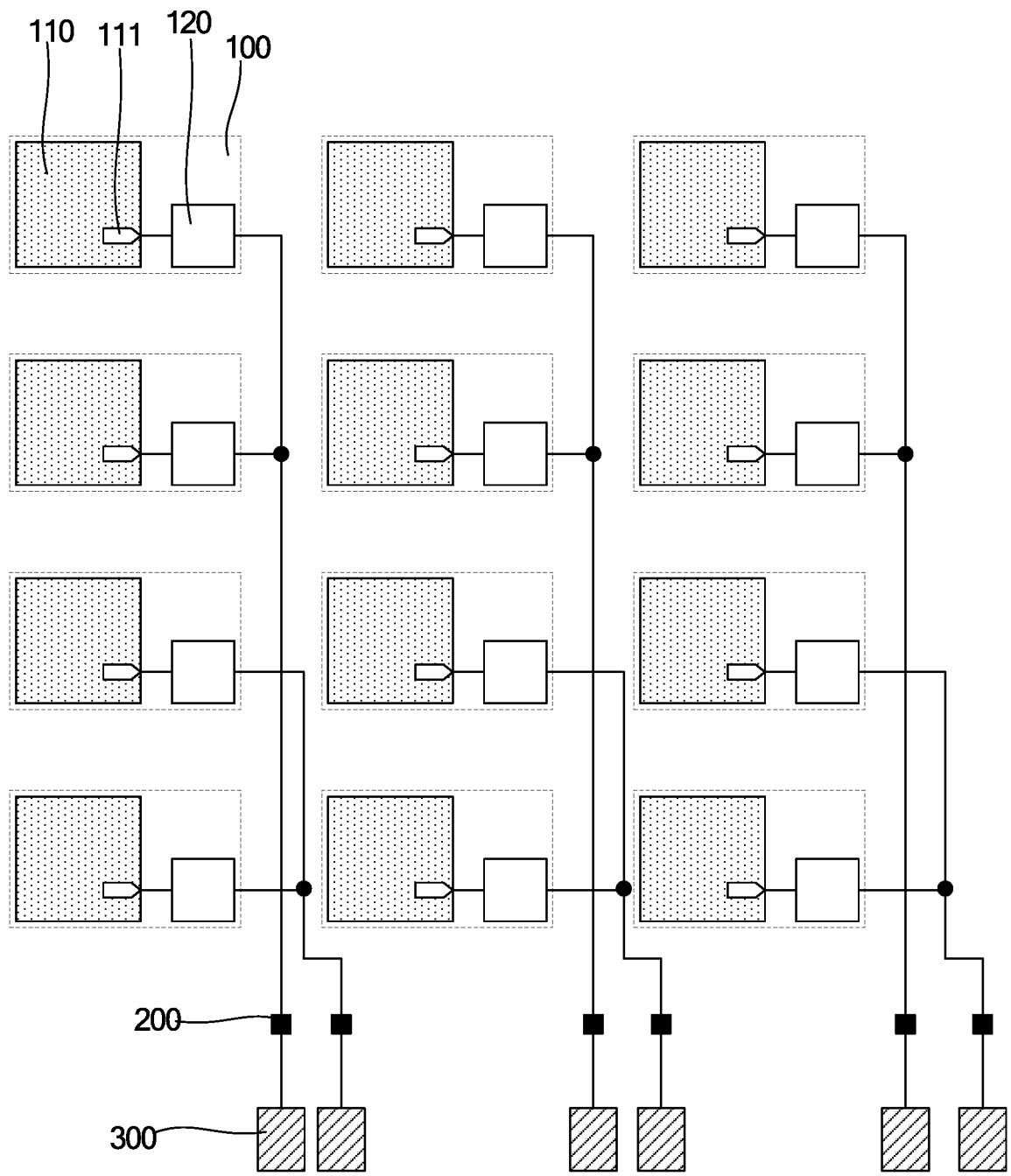
FIG. 2 is a schematic structural diagram of a circuit board according to another embodiment of the present disclosure.

In the embodiment of the present disclosure, the detection devices 120 in one row of the pixel circuits 100 are electrically connected to different detection terminals 200, and a short circuit between the pixel circuits 100 in the same row due to connection to the same detection terminal may be avoided. According to an embodiment of the present disclosure, as shown in FIG. 1, the pixel circuits 100 are connected to the detection terminals 200 in a one-to-one correspondence. In one embodiment, as shown in FIG. 2, each detection terminal 200 is electrically connected to multiple pixel circuits 100, but the pixel circuits 100 connected to one detection terminal 200 are located in different rows.

In the embodiment, in a process of the electrical performance detection, the signal output terminal is electrically connected to the detection terminal to detect the drive signal by the electrical performance detection circuit. Thus, whether the circuit board is abnormal is determined, to achieving the electrical performance detection of the circuit board. In addition, in a process other than the electrical performance detection, the signal output terminal is disconnected from the detection terminal to avoid affecting a normal operation of the circuit board. With the embodiments of the present disclosure, the electrical performance detection of the circuit board is realized, a defective circuit board may be prevented from flowing into a subsequent fabricating procedure, and waste of assembling resources may be avoided.

In an embodiment of the present disclosure, the circuit board may be an array substrate, or may be a backlight panel of a liquid crystal display device, which is not specifically limited herein. When the circuit board is an array substrate, the array substrate may be divided into a display area and a non-display area on a periphery of the display area. The pixel circuits may be located in the display area, and the detection terminals may be located in the non-display area. In an embodiment, the non-display area may be provided surrounding the display area.

In an embodiment of the present disclosure, a wiring structure of the circuit board may be optimized to obtain a simplified circuit structure of the circuit board. As shown in FIG. 2, which is a schematic structural diagram of a circuit board according to another embodiment of the present disclosure, at least one of the detection terminals 200 is electrically connected to multiple detection devices 120. According to an embodiment of the present disclosure, the multiple detection devices 120 electrically connected to one detection terminal 200 may be at least part of the detection devices of pixel circuits 100 in the same column, or may be the detection devices of pixel circuits 100 in different columns, or partially be the detection devices of pixel circuits 100 in the same column and partially be the detection devices of pixel circuits 100 in different columns.

In an embodiment of the present disclosure, the pixel circuits are controlled to operate in a progressive scanning manner. Therefore, the pixel circuits in the same row work simultaneously to output drive signals, and the pixel circuits in different rows do not operate simultaneously. In the embodiment of the present disclosure, the detection devices in the same row of the pixel circuits are electrically connected to different detection terminals, to prevent a short circuit between the detection devices of the pixel circuits in the same row during operation due to an electrical connection to the same detection terminal. Further, according to an embodiment of the present disclosure, at least one detection terminal is designed to be electrically connected to multiple detection devices. In this way, the number of detection terminals is reduced and the circuit structure of the circuit board is optimized.

Figure 3:
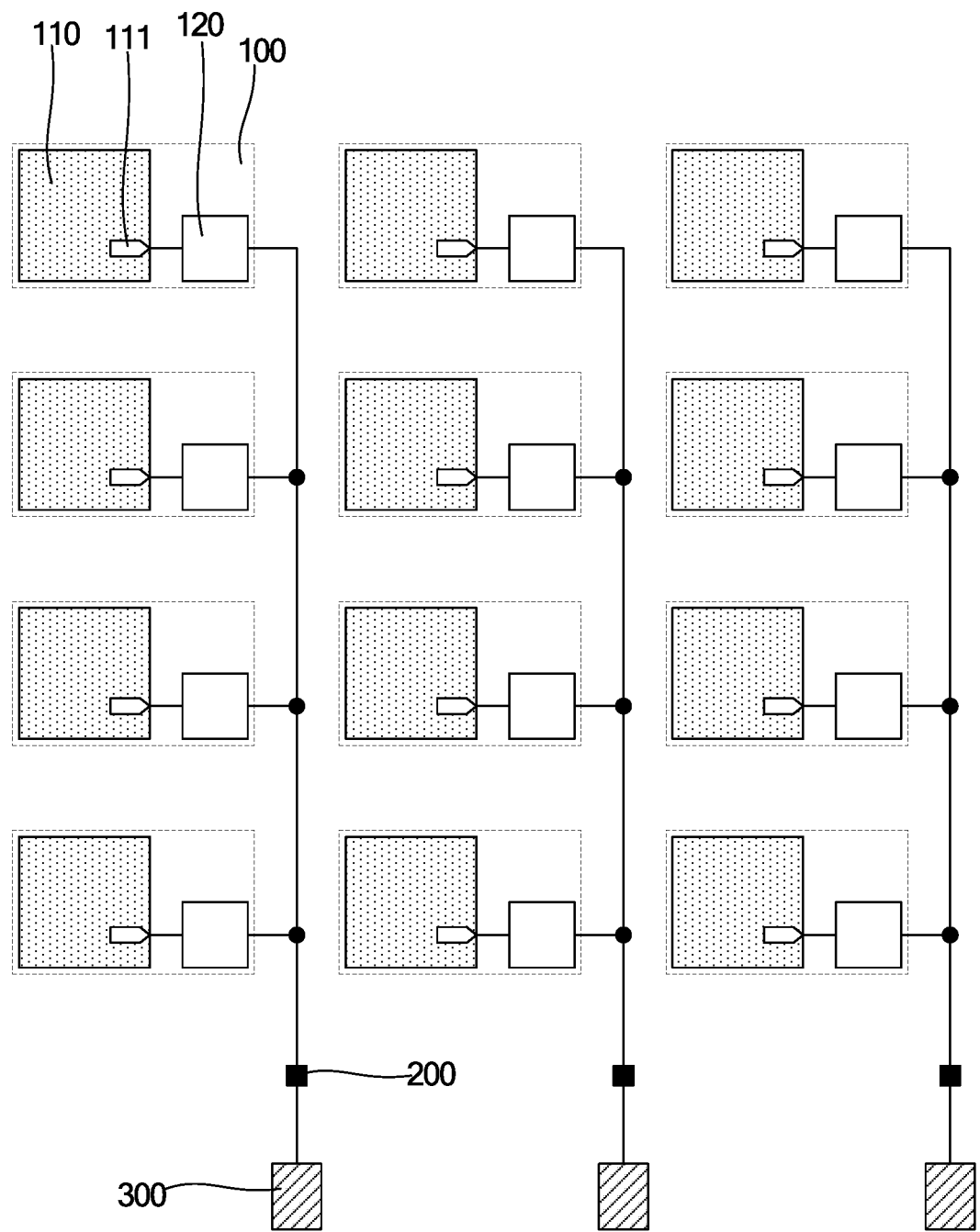
FIG. 3 is a schematic structural diagram of a circuit board according to yet another embodiment of the present disclosure.

In an example, in the circuit board according to an embodiment of the present disclosure, more detection terminals are electrically connected to respective detection devices, and the number of detection terminals is further reduced. As shown in FIG. 3, the pixel circuits 100 may be arranged in an array. For example, the pixel circuits 100 are arranged in multiple columns and in multiple rows. The detection devices 120 of at least one column of the pixel circuits 100 are electrically connected to the same detection terminal 200.

It should be noted that the pixel circuits in the embodiments of the present disclosure are not limited to being arranged in multiple columns, but may be arranged in other ways, as long as the detection devices in the same row of the pixel circuits are electrically connected to different detection terminals.

In an embodiment of the present disclosure, the detection device is configured to electrically connect the signal output terminal to the detection terminal in a process of an electrical performance detection and when a drive signal is outputted from the signal output terminal; and disconnect the signal output terminal from the detection terminal in a process other than the electrical performance detection. That is, the detection device in the embodiment of the present disclosure may include a controllable switching device that can electrically connect or disconnect the signal output terminal with the detection terminal under the control of a signal.

Figure 4:
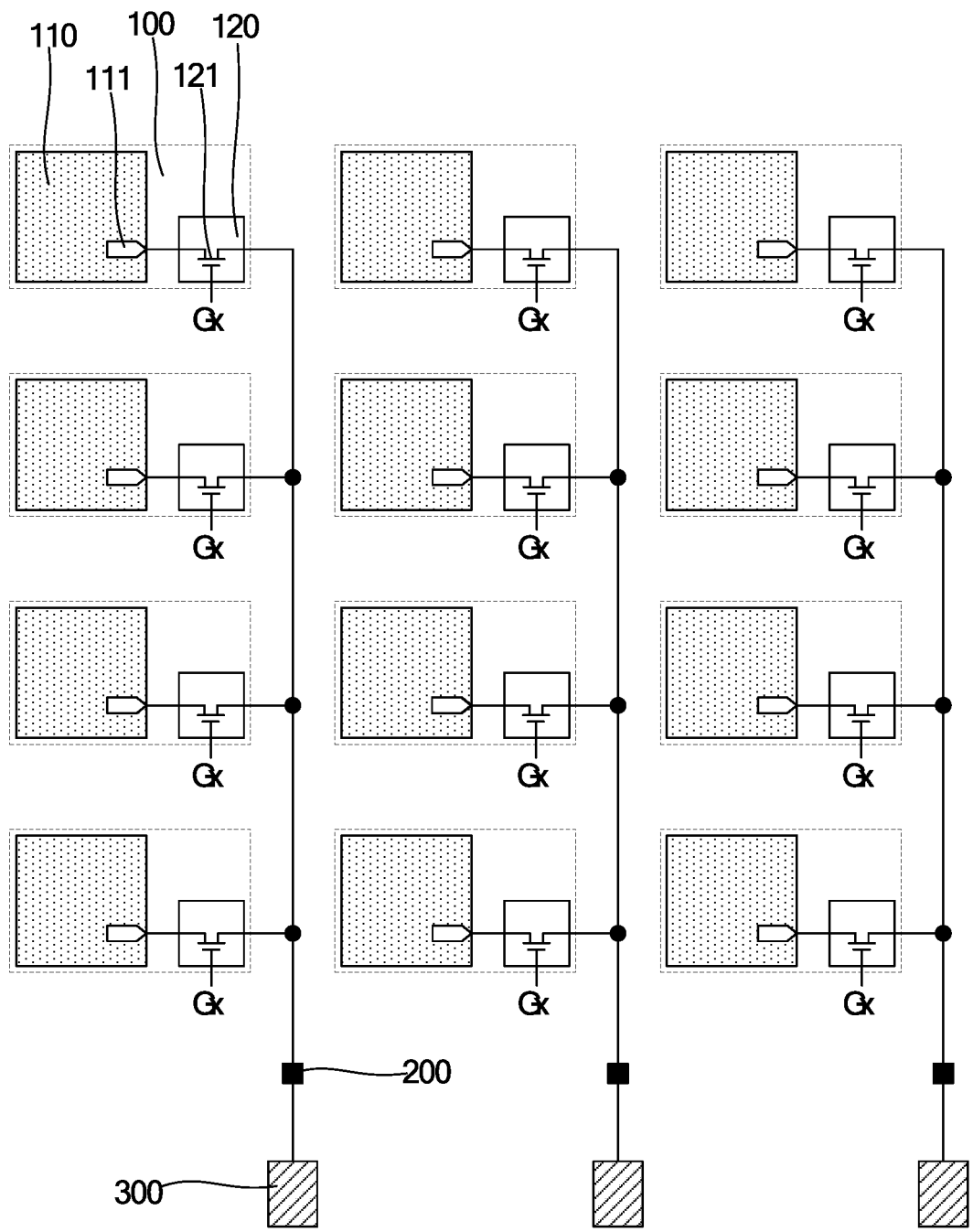
FIG. 4 is a schematic structural diagram of a circuit board according to yet another embodiment of the present disclosure.

FIG. 4 is a schematic structural diagram of a circuit board according to another embodiment of the present disclosure. As shown in FIG. 4, the detection device 120 includes a first transistor 121. The first transistor 121 includes a first terminal electrically connected to the signal output terminal 111, a second terminal electrically connected to the detection terminal 200, and a control terminal configured to receive an electrical performance detection signal Gx. In the process of the electrical performance detection and when the signal output terminal 111 outputs a drive signal, the first transistor 121 is turned on under a control of the electrical performance detection signal Gx. In a process other than the electrical performance detection, the first transistor 121 is turned off under a control of the electrical performance detection signal Gx.

In the case where the detection device according to an embodiment of the present disclosure includes the first transistor, the signal output terminal and the detection terminal are electrically connected or disconnected by controlling to turn on or turn off the first transistor. In the process of the electrical performance detection, when the signal output terminal outputs a drive signal, the first transistor is controlled to be turned on according to the electrical performance detection signal, to electrically connect the signal output terminal with the detection terminal. When no drive signal is outputted from the signal output terminal, the first transistor is controlled to be turned off according to the electrical performance detection signal, to disconnect the signal output terminal with the detection terminal. In addition, in a process other than the electrical performance detection, such as a display process of the display panel, and the first transistor is controlled to be turned off according to the electrical performance detection signal, to disconnect the signal output terminal with the detection terminal. In this way, a normal display on the display panel is ensured.

In an example, the first transistor in an embodiment of the present disclosure may be an N-type transistor. In this case, in the process of the electrical performance detection and when a drive signal is outputted from the signal output terminal, the electrical performance detection signal is a high-level signal, which controls the first transistor to be turned on. In a process other than the electrical performance detection, the electrical performance detection signal is a low-level signal, which controls the first transistor to be turned off. In an example, the first transistor in an embodiment of the present disclosure may be a P-type transistor. In this case, in the process of the electrical performance detection and when a drive signal is outputted from the signal output terminal, the electrical performance detection signal is a low-level signal to control the first transistor to be turned on. In a process other than the electrical performance detection, the electrical performance detection signal is a high-level signal to control the first transistor to be turned off.

In an embodiment of the present disclosure, all the first transistors may be of a same type. In addition, the electrical performance detection signals to be received by the control terminals of the first transistors in the same row of pixel circuits may be supplied through the same signal output terminal, to simplify a circuit structure. In another example, at least one of the first transistors is of a different type from the rest of the first transistors, which is not specifically limited herein.

Figure 5:
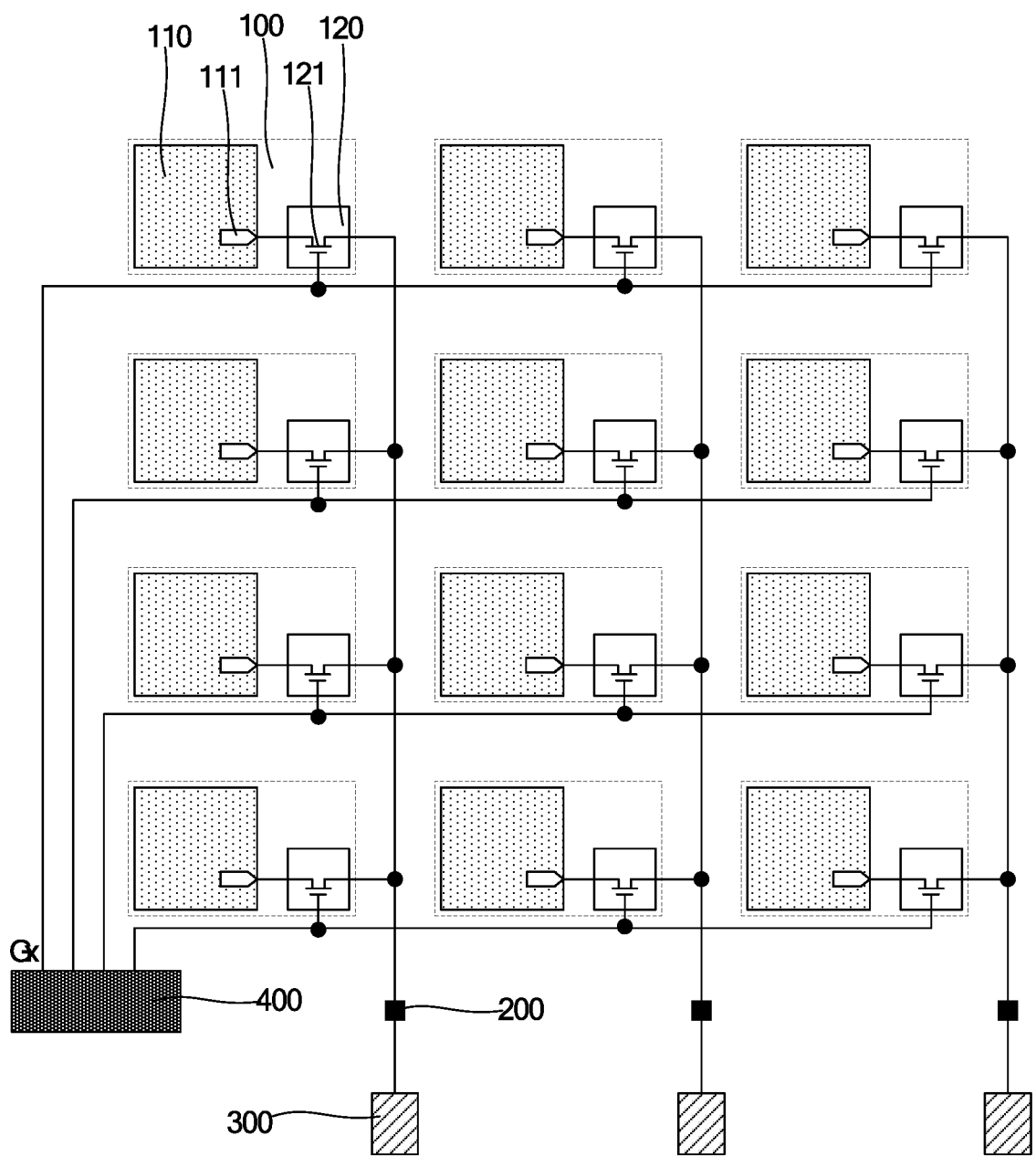
FIG. 5 is a schematic structural diagram of a circuit board according to yet another embodiment of the present disclosure.

In an embodiment of the present disclosure, the electrical performance detection signal may be supplied by a drive chip on the circuit board. In one embodiment, the electrical performance detection signal may be supplied by another circuit structure on the circuit board, such as a circuit structure independent of the drive chip, which is not specifically limited herein. FIG. 5 is a schematic structural diagram of a circuit board according to yet another embodiment of the present disclosure. As shown in FIG. 5, the circuit board includes a drive chip 400 electrically connected to the control terminal of the first transistor 121. The drive chip 400 is configured to output the electrical performance detection signal Gx to control the first transistor 121 to be turned on or off, based on a process of the electrical performance detection or the process other than the electrical performance detection.

In combination with FIG. 5, working principle of the circuit board is described in detail with an example in which the first transistors 121 are of a same type. In the embodiment of the present disclosure, the pixel circuits 100 may be arranged in an array of multiple rows and multiple columns. All the first transistors 121 may be of the same type. The detection devices 120 in the same column of the pixel circuits 100 are all connected to the same detection terminal 200. The drive chip 400 in the embodiment of the present disclosure includes multiple output ports configured to output the electrical performance detection signals. The control terminals of the first transistors 121 in the same row of the pixel circuits 100 are connected to the same output port of the drive chip 400. In the process of the electrical performance detection, the pixel circuits 100 are scanned progressively. When the pixel circuits 100 in one row are scanned and the drive signals are outputted from the signal output terminals 111, the electrical performance detection signal Gx outputted from the drive chip 400 controls the first transistors 121 of the pixel circuits 100 in the row to be turned on, to electrically connect the signal output terminals 111 with the respective detection terminals 200, and the drive signals are transmitted to the electrical performance detection circuits 300 via the detection terminals 200 for detection and analysis. In a process other than the electrical performance detection, the pixel circuits 100 are scanned progressively; and the electrical performance detection signal Gx outputted from the drive chip 400 remains the first transistors 121 of the pixel circuits 100 all in an off state, to disconnect the signal output terminals 111 with the detection terminals 200.

Figure 6:
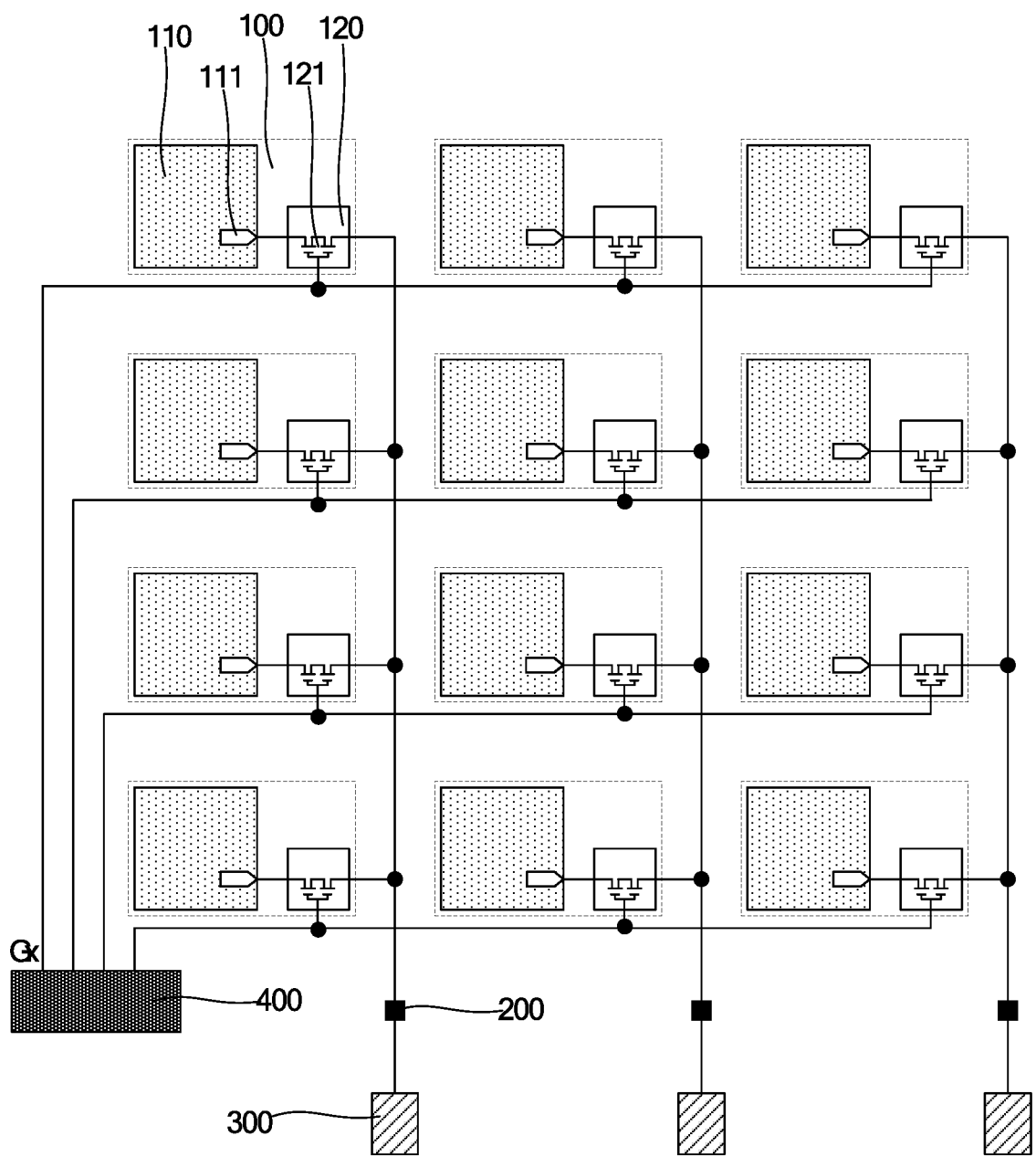
FIG. 6 is a schematic structural diagram of a circuit board according to yet another embodiment of the present disclosure.

FIG. 6 is a schematic structural diagram of a circuit board according to yet another embodiment of the present disclosure. As shown in FIG. 6, the first transistor 121 may be a dual-gate transistor. The dual-gate transistor 121 includes a first terminal electrically connected to the signal output terminal 111, a second terminal electrically connected to the detection terminal 200, and a control terminal configured to receive the electrical performance detection signal Gx. Influence on the signal output terminal 111 due to a leakage current of the first transistor 121 is further reduced by providing the first transistor 121 as the dual-gate transistor, and thus performance of the circuit board is improved.

It should be noted that a film layer including the signal output terminal 111, the detection terminal 200 and the circuit for transmitting the electrical performance detection signal Gx (which are collectively referred to as a connecting line) are not specifically limited in the embodiments of the present disclosure. In the case where the terminals of the dual-gate transistor 121 are located in the same layer as the connecting lines, the terminals of the dual-gate transistor 121 may be directly connected to the connecting lines. In the case where the terminals of the dual-gate transistor 121 are located in a different layer from the connecting lines, the terminals of the dual-gate transistor 121 may be connected to the connecting line through via holes, which should be designed based on an actual application.

Figure 7:
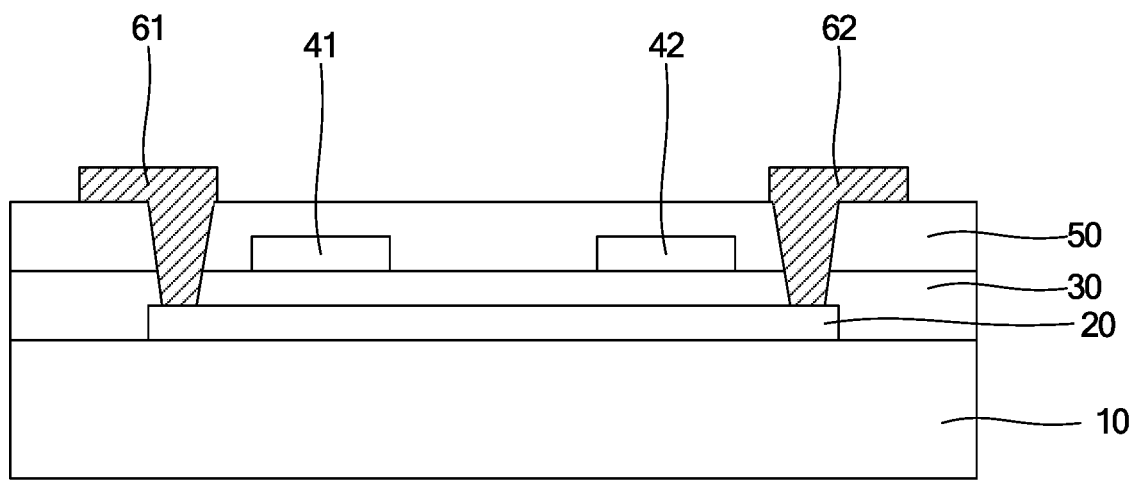
FIG. 7 is a schematic structural diagram of a dual-gate transistor in a circuit board according to an embodiment of the present disclosure.

FIG. 7 is a schematic structural diagram of a dual-gate transistor in a circuit board according to an embodiment of the present disclosure. As shown in FIG. 7, the circuit board includes: a substrate 10; a semiconductor layer 20 on a side of the substrate 10, where the semiconductor layer 20 includes an active region of the double-gate transistor 121; a gate insulating layer 30 on a side of the semiconductor layer 20 away from the substrate 10; a gate layer on a side of the gate insulating layer 30 away from the substrate 10, where the gate layer includes a first gate 41 and a second gate 42 of the dual-gate transistor 121, and the first gate 41 and the second gate 42 are connected as a control terminal of the dual-gate transistor 121; a interlayer insulating layer 50 on a side of the gate layer away from the substrate 10; a source/drain layer on a side of the interlayer insulating layer 50 away from the substrate 10, where the source/drain layer includes a source 61 and a drain 62. Each of the source 61 and the drain 62 is connected to the active region of dual-gate transistor through a via hole. One of the source 61 and the drain 62 serves as the first terminal of the dual-gate transistor 121 and the other serves as the second terminal of the dual-gate transistor 121.

Figure 8:
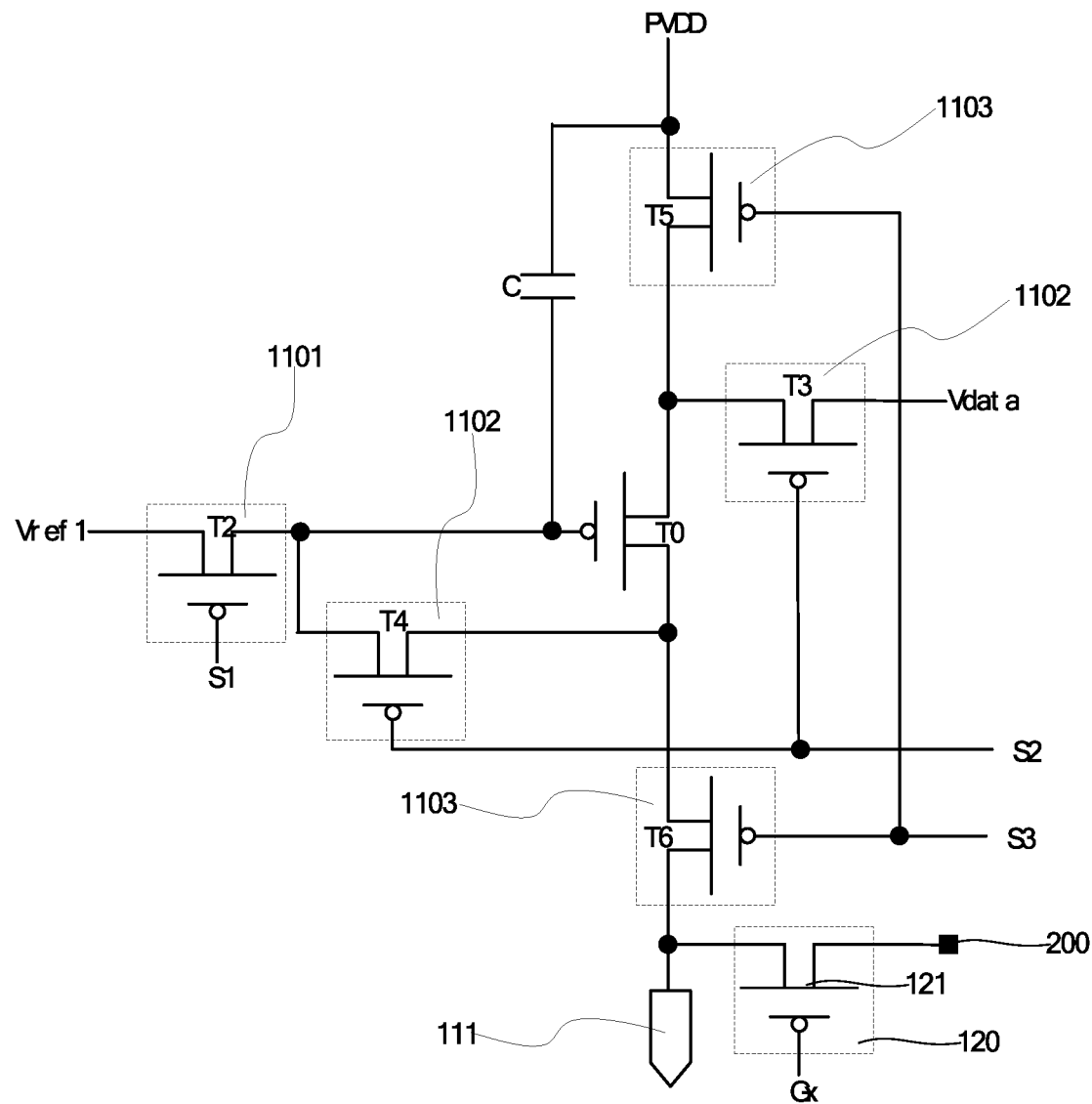
FIG. 8 is a schematic structural diagram of a drive device according to an embodiment of the present disclosure.

A circuit structure of the pixel circuit according to an embodiment of the present disclosure is described in more detail below with reference to the accompanying drawings. FIG. 8 is a schematic structural diagram of a drive device according to an embodiment of the present disclosure. As shown in FIG. 8, the drive device includes a first reset device 1101, a data writing device 1102, a light-emission control device 1103, a storage capacitor C and a drive transistor T0. The first reset device 1101 is configured to connect a control terminal of the drive transistor T0 to a first reset voltage terminal Vref1 in response to a first control signal S1. The data writing device 1102 is configured to, in response to a second control signal S2, connect a first terminal of the drive transistor T0 to a data voltage terminal Vdata, and connect the control terminal of the drive transistor T0 to a second terminal of the drive transistor T0. The light-emission control device 1103 is configured to, in response to a third control signal S3, connect the first terminal of the drive transistor T0 to a first power supply voltage terminal PVDD, and connect the second terminal of the drive transistor T0 to the signal output terminal 111. A first terminal of the storage capacitor C is electrically connected to the first power supply voltage terminal PVDD, and a second terminal of the storage capacitor C is electrically connected to the control terminal of the drive transistor T0. The drive transistor T0 is configured to output the drive signal.

In an embodiment of the present disclosure, the first reset device 1101 includes a second transistor T2. The second transistor T2 has a first terminal electrically connected to the first reset voltage terminal Vref1, a second terminal connected to the control terminal of the drive transistor T0, and a control terminal configured to receive the first control signal S1. The data writing device 1102 includes a third transistor T3 and a fourth transistor T4. The third transistor T3 has a first terminal electrically connected to the data voltage terminal Vdata, a second terminal electrically connected to the first terminal of the drive transistor T0, and a control terminal configured to receive the second control signal S2. The fourth transistor T4 has a first terminal electrically connected to the control terminal of the drive transistor T0, a second terminal electrically connected to the second terminal of the drive transistor T0, and a control terminal configured to receive the second control signal S2. The light-emission control device 1103 includes a fifth transistor T5 and a sixth transistor T6. The fifth transistor T5 has a first terminal electrically connected to the first power supply voltage terminal PVDD, a second terminal electrically connected to the first terminal of the drive transistor T0, and a control terminal configured to receive the third control signal S3. The sixth transistor T6 has a first terminal electrically connected to the second terminal of the drive transistor T0, a second terminal electrically connected to the signal output terminal 111, and a control terminal configured to receive the third control signal S3.

Figure 9:
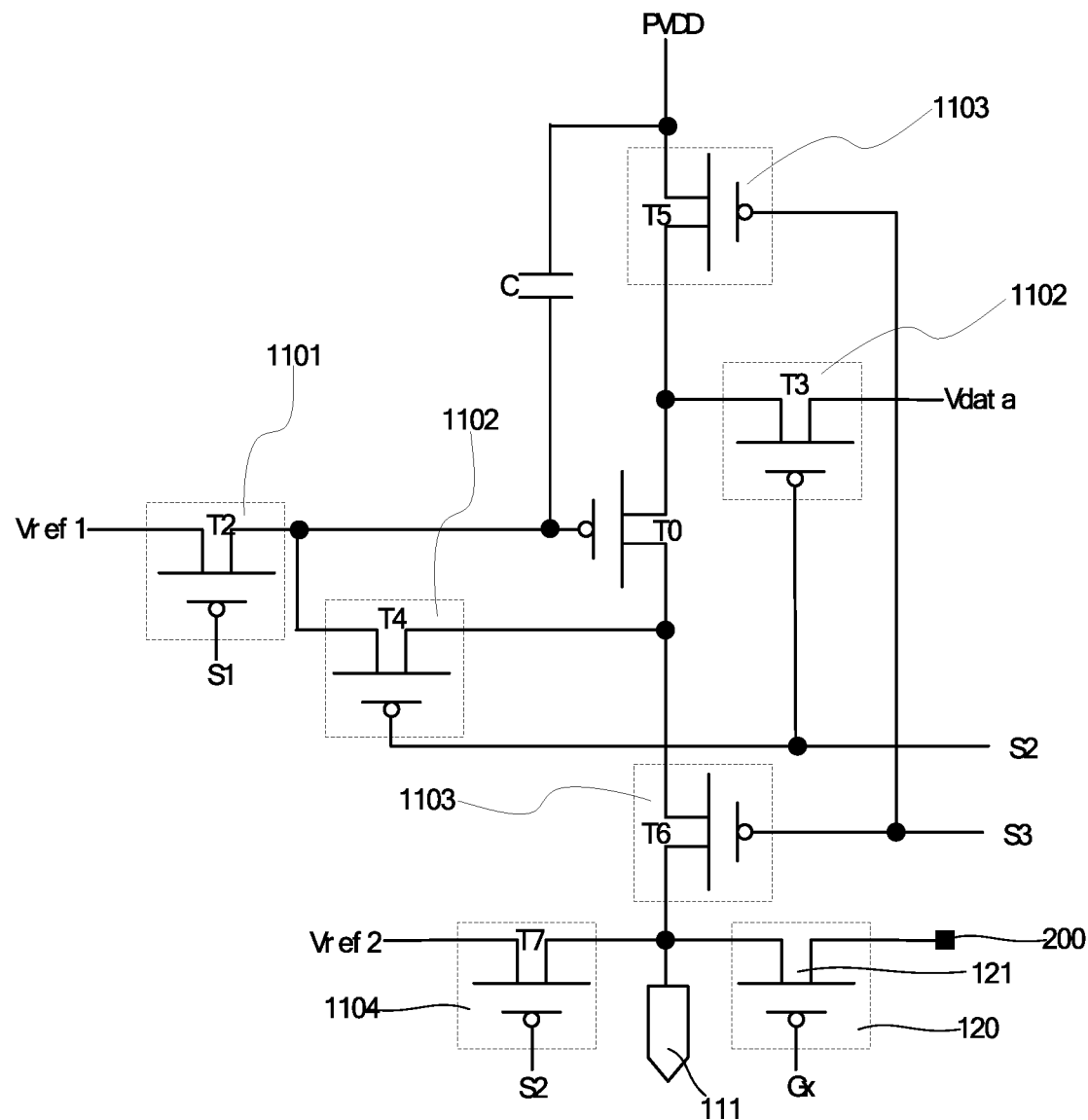
FIG. 9 is a schematic structural diagram of a drive device according to another embodiment of the present disclosure.

The pixel circuit may be further optimized according to an embodiment of the present disclosure. FIG. 9 is a schematic structural diagram of a drive device according to another embodiment of the present disclosure. As shown in FIG. 9, the drive device further includes a second reset device 1104. The second reset device 1104 is configured to connect the signal output terminal 111 to a second reset voltage terminal Vref2 in response to the control signal S2. Under the control of the second control signal S2 to the second reset device 1104, a potential at the signal output terminal 111 is reset by means of a voltage at the second reset voltage terminal Vref2. In a specific example, the second reset device 1104 includes a seventh transistor T7. The seventh transistor T7 has a first terminal connected to the second reset voltage terminal Vref2, a second terminal electrically connected to the signal output terminal 111, and the control terminal configured to receive the second control signal S2.

In an embodiment of the present disclosure, the drive transistor T0, the first transistor 121, the second transistor T2, the third transistor T3, the fourth transistor T4, the fifth transistor T5, the sixth transistor T6 and the seventh transistor T7 may be of the same type. For example, all of transistors are P-type transistors or all of transistors are N-type transistors, which facilitates preparation of the circuit structure. In another example, at least one of the drive transistor T0, the first transistor 121, the second transistor T2, the third transistor T3, the fourth transistor T4, the fifth transistor T5, the sixth transistor T6, and the seventh transistor T7 may be of a different type from the other transistors, which is not specifically limited herein.

Figure 10:
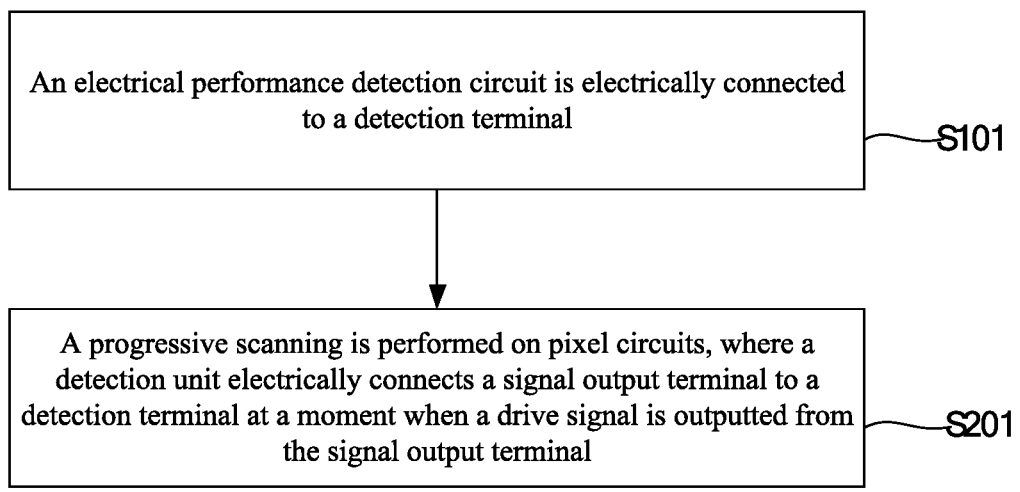
FIG. 10 is a flowchart of a method for electrical performance detection of a circuit board according to an embodiment of the present disclosure.

A method for electrical performance detection of a circuit board is further provided in an embodiment of the present disclosure. The method is intended to perform electrical performance detection on the circuit board as described in any one of the above embodiments. FIG. 10 is a flowchart of a method for electrical performance detection of a circuit board according to an embodiment of the present disclosure. As shown in FIG. 10, the method includes steps S101 to S102.

In S101, an electrical performance detection circuit is electrically connected to a detection terminal.

In S102, a progressive scanning is performed on pixel circuits, where a detection device electrically connects a signal output terminal to a detection terminal at a moment when a drive signal is outputted from the signal output terminal.

In the method for electrical performance detection according to the embodiment of the present disclosure, in a process of the electrical performance detection, an external electrical performance detection circuit is electrically connected to the detection terminal; then the circuit board is powered on to perform a progressive scanning on the pixel circuits to activate pixel circuits. The signal output terminal is controlled by a drive device to output a drive signal in a process of a light-emission control according to a timing sequence, and at the same time, the signal output terminal is electrically connected to the detection terminal by the detection device. In this way, it is ensured that the drive signal is collected by the electrical performance detection circuit for analysis and diagnose. In this way, whether the pixel circuit and the circuit board are abnormal is determined.

A process of the electrical performance detection according to an embodiment of the present disclosure is described in more detail below with reference to the accompany drawings. As shown in FIG. 8, the drive device includes the first reset device 1101, the data writing device 1102, the light-emission control device 1103, the storage capacitor C and the drive transistor T0. For each of the pixel circuits, a scanning of the pixel circuit includes a reset stage, a data writing stage and a light-emission control stage.

In the reset stage, the first reset device 1101 connects the control terminal of the drive transistor T0 to the first reset voltage terminal Vref1 in response to the first control signal S1. The data writing device 1102 and the light-emission control device 1103 stop operating in response to respective control signals. The detection device 120 disconnects the signal output terminal 111 from the detection terminal 200.

In the data writing stage, the data writing device 1102, in response to a second control signal S2, connects the first terminal of the drive transistor T0 to a data voltage terminal Vdata, and connects the control terminal of the drive transistor T0 to the second terminal of the drive transistor T0. The first reset device 1101 and the light-emission control device 1103 stop operating in response to respective control signals. The detection device 120 disconnects the signal output terminal 111 from the detection terminal 200.

In the light-emission control stage, the light-emission control device 1103, in response to a third control signal S3, connects the first terminal of the drive transistor T0 to a first power supply voltage terminal PVDD, and connects the second terminal of the drive transistor T0 to the signal output terminal 111. The detection device 120 connects the signal output terminal 111 to the detection terminal 200. The first reset device 1101 and the data writing device 1102 stop operating in response to respective control signals.

Figure 11:
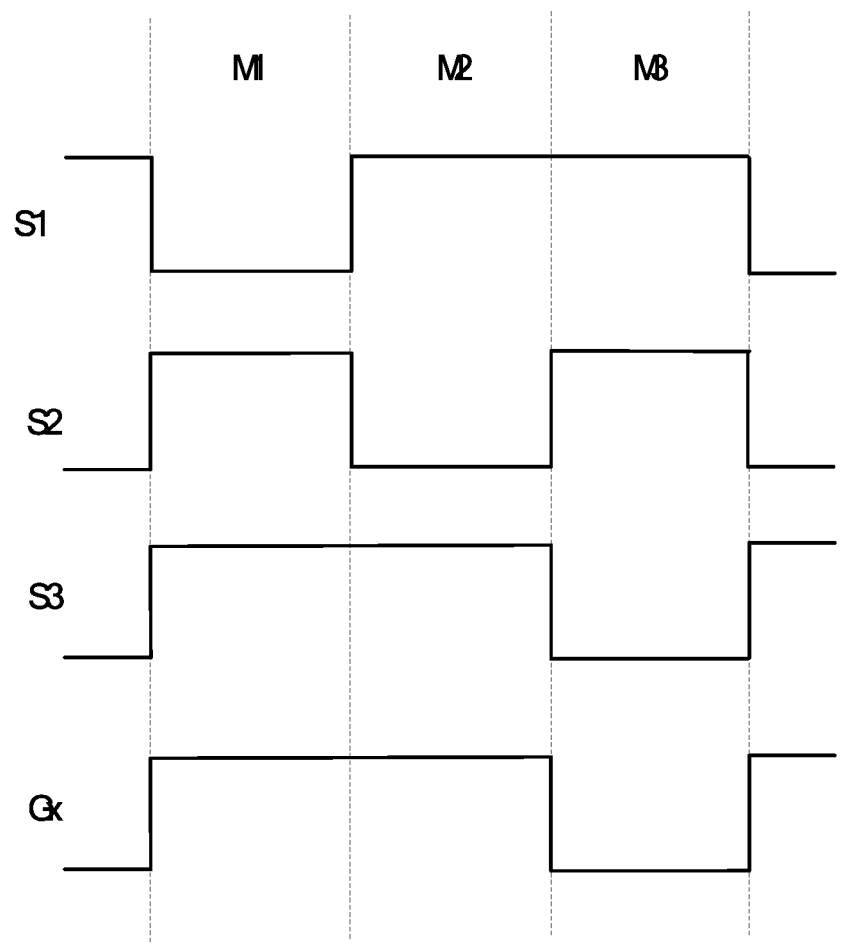
FIG. 11 is a timing diagram according to an embodiment of the present disclosure.

A working process of a pixel circuit in the electrical performance detection is described in more detail with reference to FIG. 8 and FIG. 11. FIG. 11 is a timing diagram according to an embodiment of the present disclosure. It should be noted that the following description takes a case that the drive transistor T0, the first transistor 121, the second transistor T2, the third transistor T3, the fourth transistor T4, the fifth transistor T5 and the sixth transistor T6 in FIG. 8 are all P-type transistors as an example. That is, each of the transistors is turned on when a control signal received at a control terminal thereof is a low-level signal, and the transistor is turned off when the control signal received at the control terminal thereof is a high-level signal. In the electrical performance detection, the scanning for a pixel circuit includes a reset stage M1, a data writing stage M2 and a light-emission control stage M3.

In the reset stage M1, the first control signal S1 is a low-level signal. The second transistor T2 is turned on in response to the control of the low-level signal, to electrically connect the first reset voltage terminal Vref1 to the control terminal of the drive transistor T0. Thus, the drive transistor T0 is reset. The second control signal S2, the third control signal S3 and the electrical performance detection signal Gx are all high-level signals. Thus, the first transistor 121, the third transistor T3, the fourth transistor T4, the fifth transistor T5 and the sixth transistor T6 are all turned off in response to the control of the high-level signals, respectively.

In the data writing stage M2, the second control signal S2 is a low-level signal. The third transistor T3 and the fourth transistor T4 are turned on in response to the low-level signal, to transmit a data voltage of the data voltage terminal Vdata to the drive transistor T0. The first control signal S1, the third control signal S3 and the electrical performance detection signal Gx are all high-level signals. Thus, the first transistor 121, the second transistor T2, the fifth transistor T5 and the sixth transistor T6 are all turned off in response to the control of the high-level signals, respectively.

In the light-emission control stage M3, the third control signal S3 is a low-level signal. The fifth transistor T5 and the sixth transistor T6 are turned on in response to the low-level signal, to transmit a drive signal generated by the drive transistor T0 to the signal output terminal 111. The electrical performance detection signal Gx is a low-level signal. The first transistor 121 is turned on in response to the low-level signal, to transmit the drive signal to the detection terminal 200, and the electrical performance detection circuit can perform analysis and diagnose on the drive signal. The first control signal S1 and the second control signal S2 are both high-level signals. Thus, the second transistor T2, the third transistor T3 and the fourth transistor T4 are all turned off in response to the control of the high-level signals, respectively.

The pixel circuit may be further optimized according to an embodiment of the present disclosure. As shown in FIG. 9, the drive device further includes the second reset device 1104. In the data writing stage, the second reset device 1104 connects the signal output terminal 111 to the second reset voltage terminal Vref2 in response to the second control signal S2. In this way, a potential at the signal output terminal 111 is reset by means of a voltage of the second reset voltage terminal Vref2 under the control of the second control signal S2 to the second reset device 1104.

Figure 12:
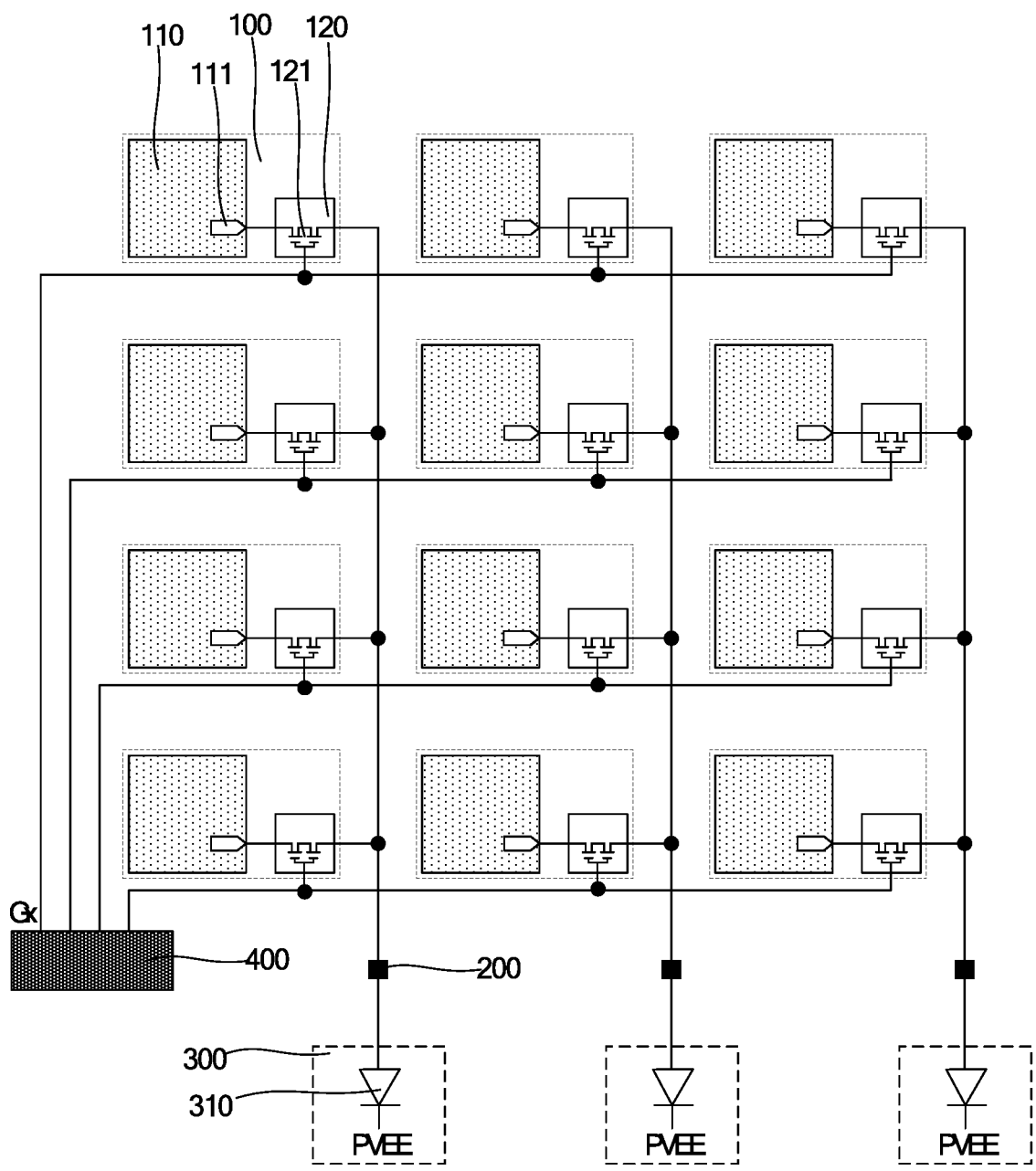
FIG. 12 is a schematic structural diagram of an electrical performance detection circuit according to an embodiment of the present disclosure.

FIG. 12 is a schematic structural diagram of an electrical performance detection circuit according to an embodiment of the present disclosure. Referring to FIG. 12, the electrical performance detection circuit 300 includes a light-emission detecting element 310. The light-emission detecting element 310 has a first terminal electrically connected to the detection terminal 200, and a second terminal electrically connected to a reference power supply voltage terminal Vt.

It may be understood that according to the embodiment of the present disclosure, a the drive signal is analyzed and diagnosed by determining whether the light-emission detecting element emits light or not, to determine whether the pixel circuit is abnormal. For example, after collecting the drive signal, the light-emission detecting element may be determined whether the pixel circuit is abnormal by determining whether the light-emission detecting element emits light or not. In another example, after collecting the drive signal, the light-emission detecting element may be determined whether the pixel circuit is abnormal based on brightness or other parameters of the light-emission detecting element, which is not specifically limited herein.

In an embodiment of the present disclosure, the light-emission detecting element may be a light-emitting diode or another type of light-emitting device, which is not specifically limited herein.

Figure 13:
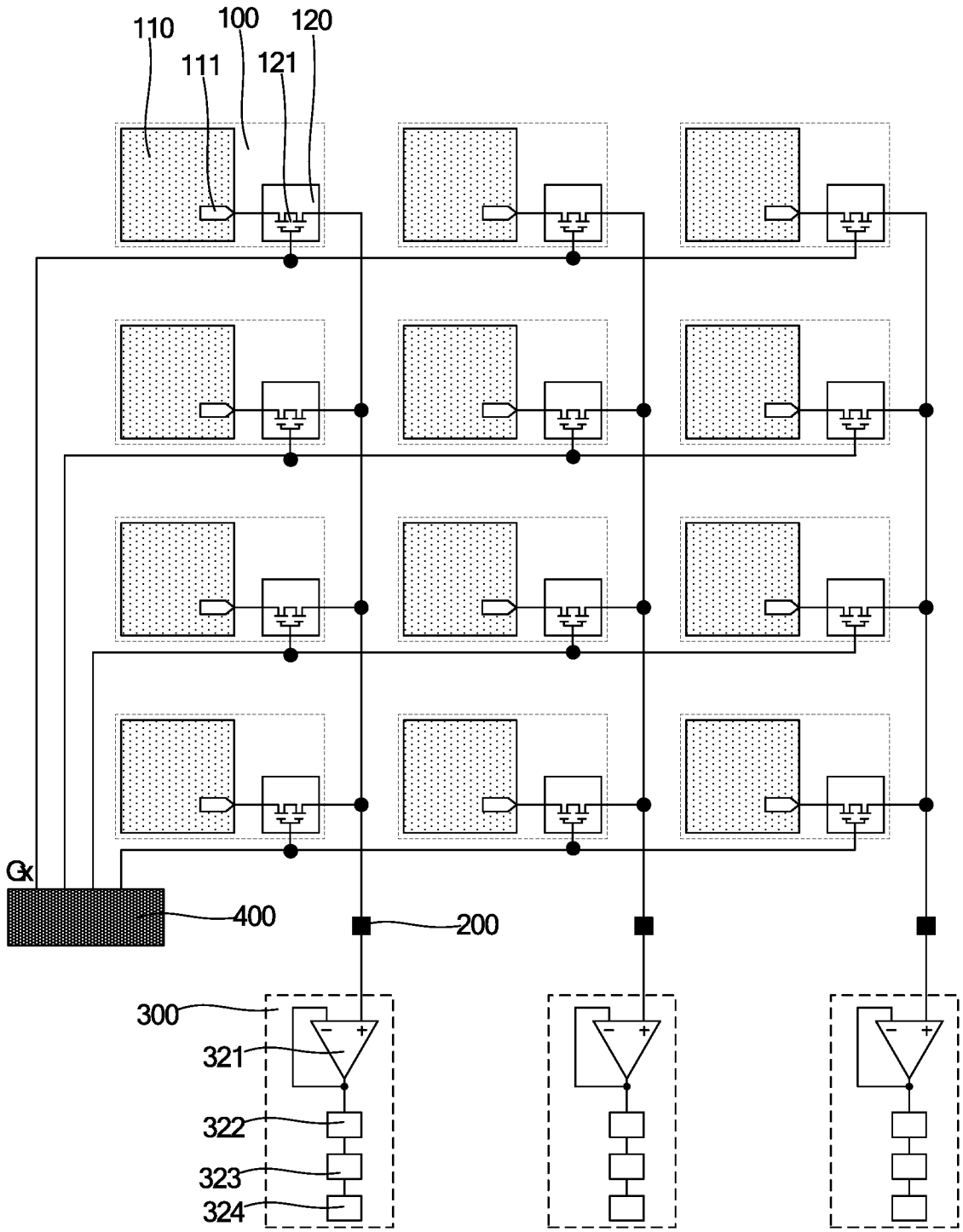
FIG. 13 is a schematic structural diagram of an electrical performance detection circuit according to another embodiment of the present disclosure.

FIG. 13 is a schematic structural diagram of an electrical performance detection circuit according to another embodiment of the present disclosure. Referring to FIG. 13, the electrical performance detection circuit in the embodiment of the present disclosure includes an operational amplifier 321, a sampling circuit 322, an analog-to-digital converter 323 and a processor 324. The operational amplifier 321 includes a first input terminal (which may be a non-inverting terminal) electrically connected to the detection terminal 200, a second input terminal (which may be an inverting terminal) electrically connected to an output terminal of the operational amplifier 321, and the output terminal electrically connected to an input terminal of the sampling circuit 322. An output terminal of the sampling circuit 322 is electrically connected to an input terminal of the analog-to-digital converter 323. An output terminal of the analog-to-digital converter 323 is electrically connected to the processor 324.

It may be understood that the electrical performance detection circuit according to the embodiment of the present disclosure collects a drive signal, the drive signal is buffered by the operational amplifier and then outputted to the sampling circuit. The sampling circuit may be a correlated double sampling (CDS) circuit. The sampling circuit latches the received drive signal and performs a logic operation on the drive signal. Then, the drive signal after logical operation is outputted to the analog-to-digital converter. The analog-to-digital converter detects and quantizes the received drive signal. Then, the quantized drive signal is transmitted to the processor. The processor analyzes the received drive signal to determine whether the pixel circuit is abnormal. For example, the processor may compare the drive signal (such as a drive voltage) with a standard signal (such as a standard voltage). When the drive signal is beyond a range of the standard signal, it is determined that the pixel circuit is abnormal. When the drive signal is within the range of the standard signal, it is determined that the pixel circuit is normal.

Figure 14:
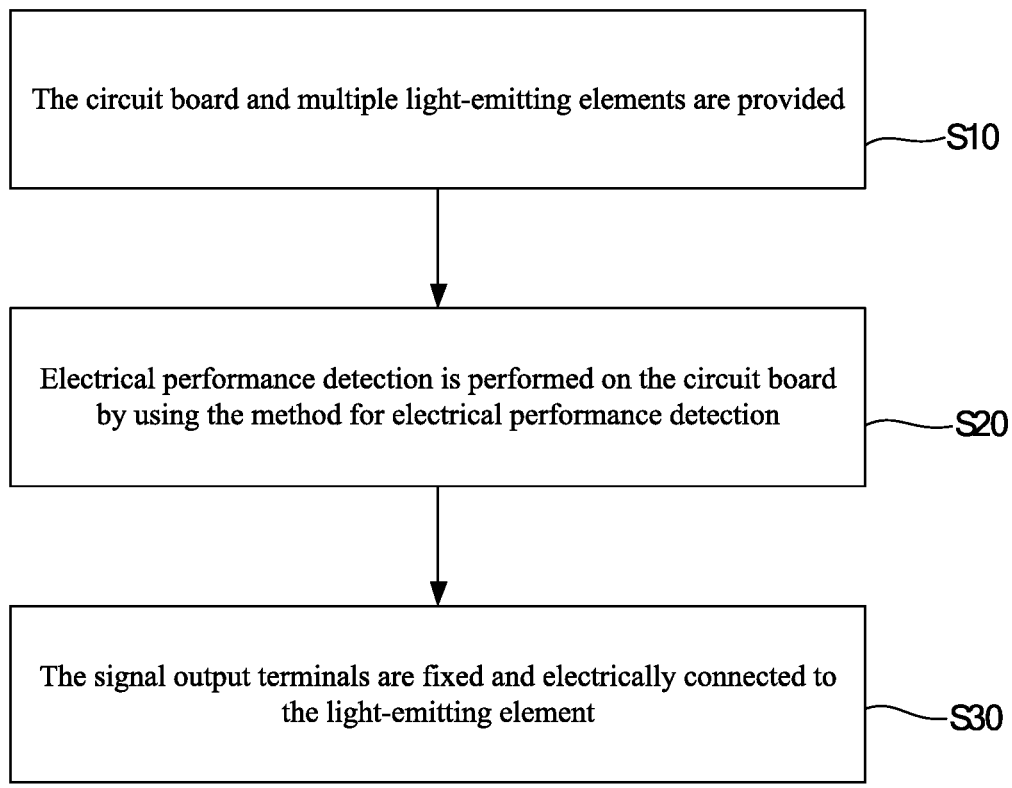
FIG. 14 is a flowchart of a method for fabricating a display panel according to an embodiment of the present disclosure.

A method for fabricating a display panel is further provided in an embodiment of the present disclosure. FIG. 14 is a flowchart of a method for fabricating a display panel according to an embodiment of the present disclosure. Referring to FIG. 14, the method includes steps S10 to S30.

In S10, the circuit board as described in any one of the above embodiments and multiple light-emitting elements are provided.

In S20, electrical performance detection is performed on the circuit board by using the method for electrical performance detection as provided in any one of the foregoing embodiments.

In S30, the signal output terminals are fixed and electrically connected to the light-emitting element.

It may be understood that, with method for fabricating a display panel according to the embodiment of the present disclosure, a piece-making process (in which signal output terminals and light-emitting elements are fixed and electrically connected) is required to be carried out after a circuit board is qualified through electrical performance detection, to prevent a defective circuit board from flowing into a subsequent procedure, and avoid waste of assembling resources.

In an embodiment of the present disclosure, the light-emitting element may be a light-emitting diode, which may for example be a Mini-LED.

Figure 15:
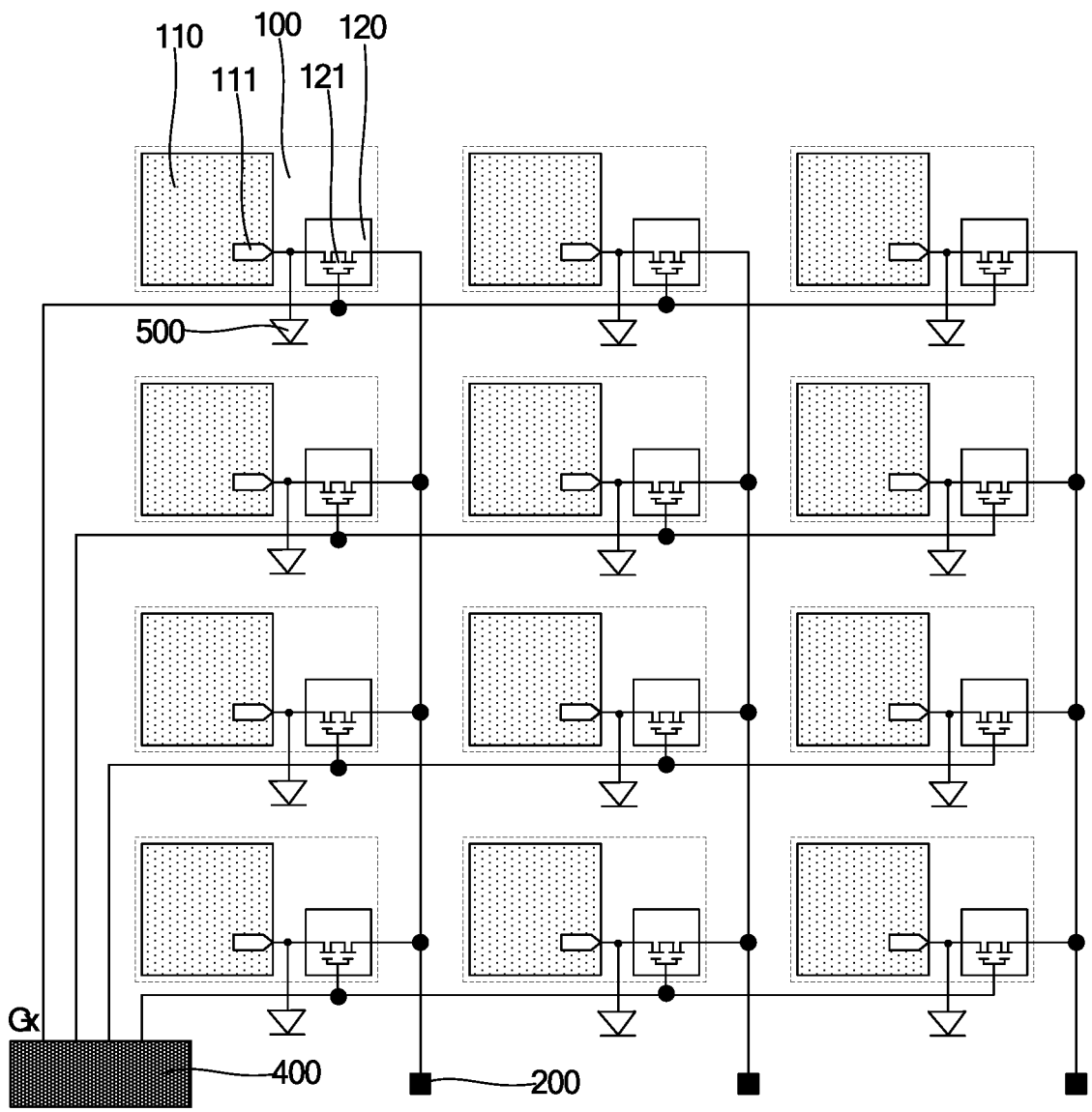
FIG. 15 is a schematic structural diagram of a display panel according to an embodiment of the present disclosure.

A display panel is further provided in an embodiment of the present disclosure. The display panel is fabricated by using the fabrication method as described in any one of the embodiments. FIG. 15 is a schematic structural diagram of a display panel according to an embodiment of the present disclosure. As shown in FIG. 15, the display panel includes the circuit board as provided in any one of the above embodiments and multiple light-emitting elements 500. Each of the light-emitting elements 500 is electrically connected to a signal output terminal 111.

In an embodiment of the present disclosure, the display panel is applicable to a mobile terminal, a notebook, a tablet, a computer, a wearable device, and the like, which is not specifically limited herein. In addition, the light-emitting element in an embodiment of the present disclosure may be a light-emitting diode, which may for example be a Mini-LED.

A method for driving a display panel is further provided according to an embodiment of the present disclosure. The method is used for driving the display panel as provided in any one of the above embodiments. The method includes: performing progressive scanning on the pixel circuits, during which the detection device keeps disconnecting the signal output terminal from the detection terminal.

It may be understood that when the display panel as provided in any of the embodiments of the present disclosure is driven to display, the detection device keeps disconnecting the signal output terminal from the detection terminal, in order to prevent a short circuit between the pixel circuits through a detection terminal, to ensure normal display on the display panel.

A process of driving the display panel according to an embodiment of the present disclosure is described in more detail below with reference to an accompanying drawing. Referring to FIG. 8, a drive device includes a first reset device 1101, a data writing device 1102, a light-emission control device 1103, a storage capacitor C and a drive transistor T0. A scanning for one of pixel circuits includes a reset stage, a data writing stage and a light-emission control stage.

In the reset stage, the first reset device 1101 connects a control terminal of the drive transistor T0 to a first reset voltage terminal Vref1 in response to a first control signal S1. The data writing device 1102 and the light-emission control device 1103 stop operating in response to respective control signals. The detection device 120 disconnects the signal output terminal 111 from the detection terminal 200.

In the data writing stage, the data writing device 1102, in response to a second control signal S2, connects the first terminal of the drive transistor T0 to a data voltage terminal Vdata, and connects the control terminal of the drive transistor T0 to the second terminal of the drive transistor T0. The first reset device 1101 and the light-emission control device 1103 stop operating in response to respective control signals. The detection device 120 disconnects the signal output terminal 111 from the detection terminal 200.

In the light-emission control stage, the light-emission control device 1103, in response to a third control signal S3, connects the first terminal of the drive transistor T0 to a first power supply voltage terminal PVDD, and connects the second terminal of the drive transistor T0 to the signal output terminal 111. The first reset device 1101 and the data writing device 1102 stop operating in response to respective control signals. The detection device 120 disconnects the signal output terminal 111 from the detection terminal 200.

Figure 16:
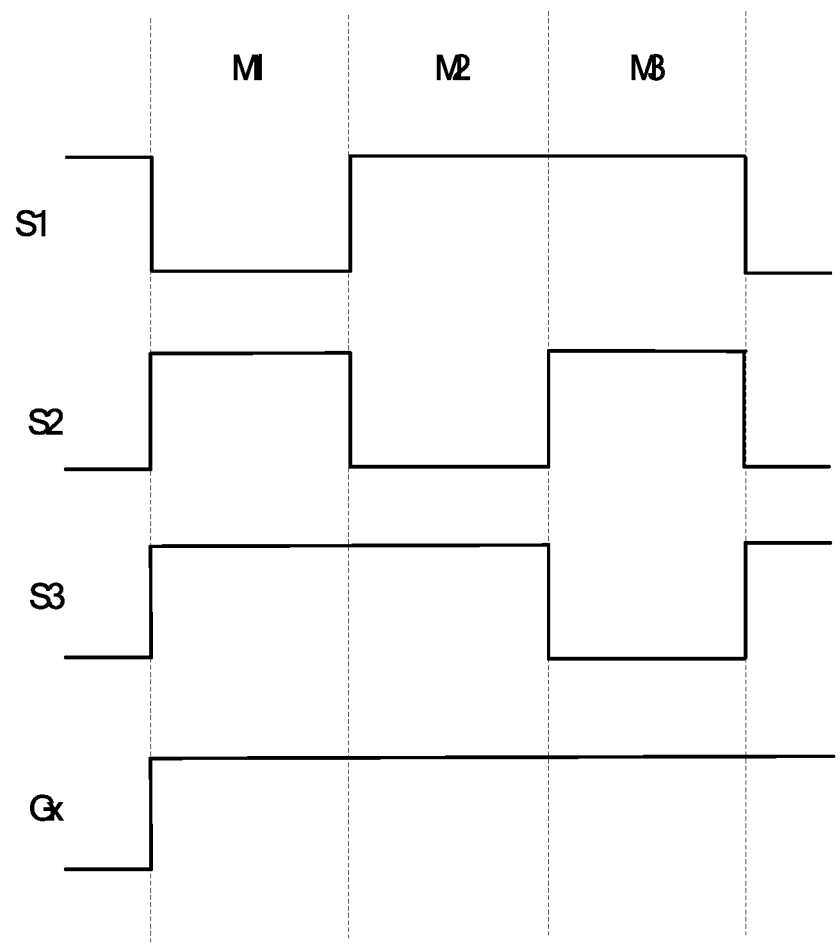
FIG. 16 is a timing diagram according to another embodiment of the present disclosure.

The method for driving the display panel according to an embodiment of the present disclosure is described in more detail with reference to FIG. 8 and FIG. 16. That is, a working process of a pixel circuit in a process other than the electrical performance detection is described as follows. FIG. 16 is a timing diagram according to another embodiment of the present disclosure. It should be noted that the following description takes a case that the drive transistor T0, the first transistor 121, the second transistor T2, the third transistor T3, the fourth transistor T4, the fifth transistor T5 and the sixth transistor T6 in FIG. 8 are all P-type transistors as an example. That is, each of the transistors is turned on when a control signal received at a control terminal thereof is a low-level signal, and the transistor is turned off when the control signal received at the control terminal thereof is a high-level signal. In a process of driving the display panel, that is, in a process other than the electrical performance detection, a scanning for a pixel circuit includes a reset stage M1, a data writing stage M2 and a light-emission control stage M3.

In the reset stage M1, the first control signal S1 is a low-level signal. The second transistor T2 is turned on in response to the control of the low-level signal, to electrically connect the first reset voltage terminal Vref1 to the control terminal of the drive transistor T0. Thus, the drive transistor T0 is reset. The second control signal S2, the third control signal S3 and the electrical performance detection signal Gx are all high-level signals. Thus, the first transistor 121, the third transistor T3, the fourth transistor T4, the fifth transistor T5 and the sixth transistor T6 are turned off in response to the control of the high-level signals, respectively.

In the data writing stage M2, the second control signal S2 is a low-level signal. The third transistor T3 and the fourth transistor T4 are turned on in response to the low-level signal, to transmit a data voltage of the data voltage terminal Vdata to the drive transistor T0. The first control signal S1, the third control signal S3 and the electrical performance detection signal Gx are all high-level signals. Thus, the first transistor 121, the second transistor T2, the fifth transistor T5 and the sixth transistor T6 are all turned off in response to the control of the high-level signals, respectively.

In the light-emission control stage M3, the third control signal S3 is a low-level signal. The fifth transistor T5 and the sixth transistor T6 are turned on in response to the low-level signal, to transmit a drive signal generated by the drive transistor T0 to the signal output terminal 111. The first control signal S1, the second control signal S2 and the electrical performance detection signal Gx are all high-level signals. Thus, the first transistor 121, the second transistor T2, the third transistor T3 and the fourth transistor T4 are all turned off in response to the control of the high-level signals, respectively.

A circuit board and a method for electrical performance detection of a circuit board, a display panel, a method for fabricating a display panel, and a method for driving the display panel are provided in the embodiments of the present disclosure. The circuit board includes multiple rows of pixel circuits for progressive scanning, and multiple detection terminals. Each of the pixel circuits includes a drive device and a detection device. The drive device includes a signal output terminal for outputting a drive signal. The detection device has an input terminal electrically connected to the signal output terminal, and an output terminal electrically connected to the detection terminal. The detection devices in one row of the pixel circuits are electrically connected to different detection terminals. The detection terminal is electrically connected to an external electrical performance detection circuit. The detection device is configured to electrically connect the signal output terminal to the detection terminal, in a process of an electrical performance detection and when a drive signal is outputted from the signal output terminal; and disconnect the signal output terminal from the detection terminal in a process other than the electrical performance detection.

In the electrical performance detection according to the embodiment, the signal output terminal is electrically connected to the detection terminal. The electrical performance detection circuit performs a detection on the drive signal to determine whether the circuit board is abnormal, achieving the electrical performance detection of the circuit board. In addition, in the process other than the electrical performance detection, the signal output terminal is disconnected from the detection terminal to avoid affecting a normal operation of the circuit board. With the embodiments of the present disclosure, the electrical performance detection of the circuit board is realized, a defective circuit board may be prevented from flowing into a subsequent fabricating procedure, and waste of assembling resources may be avoided.

What is claimed is:

1. A circuit board, comprising a plurality of rows of pixel circuits for progressive scanning, and a plurality of detection terminals, wherein
one pixel circuit of the plurality of rows of pixel circuits comprises a drive unit and a detection unit,
the drive unit comprises a signal output terminal for outputting a drive signal,
the detection unit comprises an input terminal electrically connected to the signal output terminal, and an output terminal electrically connected to one of the plurality of detection terminals,
the detection units in one row of the pixel circuits are electrically connected to different detection terminals,
the detection terminal is electrically connected to an external electrical performance detection circuit, and
wherein the detection unit is configured to electrically connect the signal output terminal to the detection terminal in a process of electrical performance detection and when the drive signal is outputted from the signal output terminal; and disconnect the signal output terminal from the detection terminal in a process other than the electrical performance detection,
wherein the drive unit comprises a first reset module, a data writing module, a light-emission control module, a storage capacitor, and a drive transistor, wherein
the first reset module is configured to connect a control terminal of the drive transistor to a first reset voltage terminal in response to a first control signal;
the data writing module is configured to, in response to a second control signal, connect a first terminal of the drive transistor to a data voltage terminal, and connect the control terminal of the drive transistor to a second terminal of the drive transistor;
the light-emission control module is configured to, in response to a third control signal, connect the first terminal of the drive transistor to a first power supply voltage terminal, and connect the second terminal of the drive transistor to the signal output terminal; and
a first terminal of the storage capacitor is electrically connected to the first power supply voltage terminal, and a second terminal of the storage capacitor is electrically connected to the control terminal of the drive transistor, and the drive transistor is configured to output the drive signal.

2. The circuit board according to claim 1, wherein at least one of the detection terminals is electrically connected to a plurality of detection units.

3. The circuit board according to claim 2, wherein the pixel circuits are arranged in a plurality of columns, and detection units in at least one column of the pixel circuits are electrically connected to a same detection terminal.

4. The circuit board according to claim 1, wherein
the detection unit comprises a first transistor, and the first transistor comprises a first terminal electrically connected to the signal output terminal, a second terminal electrically connected to the detection terminal, and a control terminal configured to receive an electrical performance detection signal; and
wherein the first transistor is turned on under a control of the electrical performance detection signal in the process of the electrical performance detection and when the drive signal is outputted from the signal output terminal; and the first transistor is turned off under the control of the electrical performance detection signal in the process other than the electrical performance detection.

5. The circuit board according to claim 4, wherein the first transistor is a dual-gate transistor.

6. The circuit board according to claim 1, wherein the drive unit further comprises a second reset module, wherein the second reset module is configured to connect the signal output terminal to a second reset voltage terminal in response to the second control signal.

7. A method for electrical performance detection of a circuit board, wherein the circuit board comprises a plurality of rows of pixel circuits for progressive scanning and a plurality of detection terminals, one pixel circuit of the plurality of rows of the pixel circuits comprises a drive unit and a detection unit; the drive unit comprises a signal output terminal for outputting a drive signal; and the detection unit comprises an input terminal electrically connected to the signal output terminal, and an output terminal electrically connected to one of the plurality of detection terminals; the detection units in one row of the pixel circuits are electrically connected to different detection terminals, and the detection terminal is electrically connected to an external electrical performance detection circuit; and
wherein the method comprises:
electrically connecting an electrical performance detection circuit to one of the plurality of detection terminals; and
performing a progressive scanning on the pixel circuits; and the detection unit electrically connects the signal output terminal to the detection terminal at a moment when the drive signal is outputted from the signal output terminal, in a process of the progressive scanning,
wherein the drive unit comprises a first reset module, a data writing module, a light-emission control module, a storage capacitor, and a drive transistor, and a scanning for one of the pixel circuits comprises a reset stage, a data writing stage and a light-emission control stage, wherein
in the reset stage, the first reset module connects a control terminal of the drive transistor to a first reset voltage terminal in response to a first control signal; the data writing module and the light-emission control module are deactivated in response to respective control signals; and the detection unit disconnects the signal output terminal from the detection terminal;
in the data writing stage, the data writing module connects a first terminal of the drive transistor to a data voltage terminal and connects the control terminal of the drive transistor to a second terminal of the drive transistor, in response to the second control signal; the first reset module and the light-emission control module are deactivated in response to respective control signals; and the detection unit disconnects the signal output terminal from the detection terminal; and
in the light-emission control stage, the light-emission control module connects the first terminal of the drive transistor to a first power supply voltage terminal and connects the second terminal of the drive transistor to the signal output terminal, in response to the third control signal; the detection unit connects the signal output terminal to the detection terminal; and the first reset module and the data writing module are deactivated in response to respective control signals.

8. The method for electrical performance detection of the circuit board according to claim 7, wherein the drive unit further comprises: a second reset module configured to connect the signal output terminal to a second reset voltage terminal in response to the second control signal in the data writing stage.

9. The method for electrical performance detection of the circuit board according to claim 7, wherein the electrical performance detection circuit comprises a light-emission detecting element,
wherein the light-emission detecting element comprises a first terminal electrically connected to the detection terminal, and a second terminal electrically connected to a reference power supply voltage terminal.

10. The method for electrical performance detection of the circuit board according to claim 7, wherein the electrical performance detection circuit comprises an operational amplifier, a sampling circuit, an analog-to-digital converter and a processor, wherein
the operational amplifier comprises a first input terminal electrically connected to the detection terminal, a second input terminal electrically connected to an output terminal of the operational amplifier, and the output terminal electrically connected to an input terminal of the sampling circuit, and
an output terminal of the sampling circuit is electrically connected to an input terminal of the analog-to-digital converter, and an output terminal of the analog-to-digital converter is electrically connected to the processor.

11. A display panel, comprising:
a circuit board, wherein the circuit board comprises a plurality of rows of pixel circuits for progressive scanning, and a plurality of detection terminals,
one pixel circuit of the plurality of rows of pixel circuits comprises a drive unit and a detection unit,
the drive unit comprises a signal output terminal for outputting a drive signal,
the detection unit comprises an input terminal electrically connected to the signal output terminal, and an output terminal electrically connected to one of the plurality of detection terminals,
the detection units in one row of the pixel circuits are electrically connected to different detection terminals,
the detection terminal is electrically connected to an external electrical performance detection circuit, and
wherein the detection unit is configured to electrically connect the signal output terminal to the detection terminal in a process of electrical performance detection and when the drive signal is outputted from the signal output terminal; and disconnect the signal output terminal from the detection terminal in a process other than the electrical performance detection; and
a plurality of light-emitting elements, wherein the light-emitting elements are electrically connected to the signal output terminals,
wherein the drive unit comprises a first reset module, a data writing module, a light-emission control module, a storage capacitor and a drive transistor, wherein
the first reset module is configured to connect a control terminal of the drive transistor to a first reset voltage terminal in response to a first control signal;

the data writing module is configured to, in response to a second control signal, connect a first terminal of the drive transistor to a data voltage terminal, and connect the control terminal of the drive transistor to a second terminal of the drive transistor;
the light-emission control module is configured to, in response to a third control signal, connect the first terminal of the drive transistor to a first power supply voltage terminal, and connect the second terminal of the drive transistor to the signal output terminal; and
a first terminal of the storage capacitor is electrically connected to the first power supply voltage terminal, and a second terminal of the storage capacitor is electrically connected to the control terminal of the drive transistor, and the drive transistor is configured to output the drive signal.

12. The display panel according to claim 11, wherein at least one of the detection terminals is electrically connected to a plurality of detection units.

13. The display panel according to claim 12, wherein the pixel circuits are arranged in a plurality of columns, and detection units in at least one column of the pixel circuits are electrically connected to a same detection terminal.

14. The display panel according to claim 11, wherein
the detection unit comprises a first transistor, and the first transistor comprises a first terminal electrically connected to the signal output terminal, a second terminal electrically connected to the detection terminal, and a control terminal configured to receive an electrical performance detection signal; and
wherein the first transistor is turned on under a control of the electrical performance detection signal in the process of the electrical performance detection and when the drive signal is outputted from the signal output terminal; and the first transistor is turned off under the control of the electrical performance detection signal in the process other than the electrical performance detection.

15. The display panel according to claim 14, wherein the first transistor is a dual-gate transistor.

16. A method for driving a display panel, wherein the display panel comprises a circuit board and a plurality of light-emitting elements,
wherein the circuit board comprises a plurality of rows of pixel circuits for progressive scanning and a plurality of detection terminals, one pixel circuit of the plurality of rows of the pixel circuits comprises a drive unit and a detection unit; the drive unit comprises a signal output terminal for outputting a drive signal; and the detection unit comprises an input terminal electrically connected to the signal output terminal, and an output terminal electrically connected to one of the plurality of detection terminals; the detection units in one row of the pixel circuits are electrically connected to different detection terminals, and the detection terminal is electrically connected to an external electrical performance detection circuit,
wherein the light-emitting elements are electrically connected to the signal output terminals, and
wherein the method comprises:
performing the progressive scanning on the plurality of rows of the pixel circuits, and the detection unit keeps disconnecting the signal output terminal from the detection terminal through during the progressive scanning,
wherein the drive unit comprises a first reset module, a data writing module, a light-emission control module, a storage capacitor and a drive transistor, and a scanning of one pixel circuit of the plurality of rows of the pixel circuits comprises a reset stage, a data writing stage and a light-emission control stage, wherein in the reset stage, the first reset module connects a control terminal of the drive transistor to a first reset voltage terminal in response to a first control signal; the data writing module and the light-emission control module are deactivated in response to respective control signals; and the detection unit disconnects the signal output terminal from the detection terminal;

in the data writing stage, the data writing module connects a first terminal of the drive transistor to a data voltage terminal and connects the control terminal of the drive transistor to a second terminal of the drive transistor, in response to the second control signal; the first reset module and the light-emission control module are deactivated in response to respective control signals; and the detection unit disconnects the signal output terminal from the detection terminal; and in the light-emission control stage, the light-emission control module connects the first terminal of the drive transistor to a first power supply voltage terminal and connects the second terminal of the drive transistor to the signal output terminal, in response to the third control signal; the first reset module and the data writing module are deactivated in response to respective control signals; and the detection unit disconnects the signal output terminal from the detection terminal.

* * * * *